(12) United States Patent
Carey et al.

(10) Patent No.: US 7,457,085 B2
(45) Date of Patent: Nov. 25, 2008

(54) MAGNETIC READ SENSOR EMPLOYING OBLIQUE ETCHED UNDERLAYERS FOR INDUCING UNIAXIAL MAGNETIC ANISOTROPY IN HARD MAGNETIC BIAS LAYERS

(75) Inventors: Matthew Joseph Carey, San Jose, CA (US); Jeffrey Robinson Childress, San Jose, CA (US); Eric Edward Fullerton, Morgan Hill, CA (US); Stefan Maat, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 580 days.

(21) Appl. No.: 11/096,636

(22) Filed: Mar. 31, 2005

(65) Prior Publication Data

US 2006/0222112 A1 Oct. 5, 2006

(51) Int. Cl.
*G11B 5/39* (2006.01)
(52) U.S. Cl. .............................. 360/324.12; 360/324.2
(58) Field of Classification Search ............ 360/324.12, 360/324.2
See application file for complete search history.

(56) References Cited

U.S. PATENT DOCUMENTS

| | | | |
|---|---|---|---|
| 3,943,047 A | 3/1976 | Cruzan et al. ................ | 204/192 |
| 4,309,267 A | 1/1982 | Boyd et al. ................... | 204/298 |
| 5,143,794 A | 9/1992 | Suzuki et al. ................ | 428/611 |
| 5,759,682 A | 6/1998 | Ouchi et al. ................. | 428/332 |
| 5,815,343 A | 9/1998 | Ishikawa et al. .......... | 360/97.01 |
| 6,007,623 A | 12/1999 | Thiele et al. .................. | 117/95 |
| 6,086,974 A | 7/2000 | Thiele et al. ................ | 428/65.3 |
| 6,169,303 B1 | 1/2001 | Anthony ...................... | 257/295 |
| 6,278,595 B1 * | 8/2001 | Xue et al. .............. | 360/327.31 |
| 6,331,364 B1 | 12/2001 | Baglin et al. ............. | 428/694 T |
| 6,735,850 B1 | 5/2004 | Gibbons et al. ........... | 29/603.07 |
| 6,743,529 B2 | 6/2004 | Saito et al. ............. | 428/694 SG |
| 7,342,752 B1 * | 3/2008 | Zhang et al. ........... | 360/324.12 |
| 2002/0051328 A1 | 5/2002 | Hasegawa ................... | 360/322 |
| 2003/0030947 A1 | 2/2003 | Ooshima ............... | 360/324.12 |
| 2005/0105223 A1 * | 5/2005 | Larson et al. .......... | 360/324.12 |

OTHER PUBLICATIONS

D. Sekiba, R. Moroni, G. Gonella, F. Buatier de Mongeot, C. Boragno, L. Mattera, and U. Valbusa, "Uniaxial magnetic anisotropy tuned by nanoscale ripple formation: Ion-sculpting of Co/Cu(001) thin films," Applied Physics Letters, vol. 84 No. 5, Feb. 2004.

(Continued)

Primary Examiner—Craig A Renner
(74) Attorney, Agent, or Firm—Zilka-Kotab, PC

(57) ABSTRACT

A magnetoresistive sensor having a hard bias layer with an engineered magnetic anisotropy in a direction substantially parallel with the medium facing surface. The hard bias layer may be constructed of CoPt, CoPtCr or some other magnetic material and is deposited over an underlayer that has been ion beam etched. The ion beam etch has been performed at an angle with respect to normal in order to induce anisotropic roughness on its surface for example in form of oriented ripples or facets. The anisotropic roughness induces a uniaxial magnetic anisotropy substantially parallel to the medium facing surface in the hard magnetic bias layers deposited there over.

25 Claims, 8 Drawing Sheets

OTHER PUBLICATIONS

Dr. Chen Yunjie, "Highly Oriented Media for High Density Magnetic Recording," Storage Unlimited, Jul.-Sep. 2004.

S. Rusponi, G. Costantini, F. Buatier de Mongeot, C. Boragno, and U. Valbusa, "Patterning a surface on the nanometric scale by ion sputtering," Applied Physics Letters, vol. 75 No. 21, Nov. 1999.

J.E. Lee, Y. Roh, S.C. Oh, H.-J. Kim, Y.K. Ha, J.S. Bae, I.G. Baek, S.O. Park, U.-I. Chung. and J.T. Moon, "Improved Magnetic Tunnel Junction With Amorphous Seed Layer, Surface Treatment, and High-Polarization Magnetic Materials," IEEE Transactions on Magnetics, vol. 40, No. 4, Jul. 2004.

Jan-Ulrich Thiele, M.E. Best, M.F. Toney, D. Weller, "Grain Size Control in FePt Thin Films by Ar-Ion Etched Pt Seed Layers," IEEE Transactions on Magnetics, vol. 37, No. 4, Jul. 2001.

M. Takahashi, H. Shoji, D. D. Djayaprawira, and S. Yoshimura, "Novel Sputtering Process to Reduce the Grain Size and its Distribution in Co-Based Longitudinal Thin Film Media—New Seedlayer and High $K_u^{Grain}$ Material," IEEE Transactions on Magnetics, vol. 36, No. 5, Sep. 2000.

T.C. Arnoldussen, E.M. Rossi, A. Ting, A. Brunsch, J. Schneider, and G. Trippel, "Obliquely Evaporated Iron-Cobalt and Iron-Cobalt-Chromium Thin Film Recording Media," IEEE Transactions on Magnetics, vol. 20, No. 5, Sep. 1984.

M.J. Hadley and R.J. Pollard, "Magnetic and Structural Properties of Co Films Deposited onto Obliquely Sputtered Pt Underlayers," Journal of Applied Physics, vol. 92, No. 12, Dec. 2002.

J.F. Whitacre, Z.U. Rek, J.C. Billello and S.M. Yalisove, "Surface Roughness and In-Plane Texturing in Sputtered Thin Films," Journal of Applied Physics, vol. 84, No. 3, Aug. 1998.

R. Moroni, D. Sekiba, F. Buatier de Mongeot, G. Gonella, C. Boragno, L. Mattera, and U. Valbusa, "Uniaxial Magnetic Anisotropy in Nanostructured Co/Cu(001): From Surface Ripples to Nanowires," Physical Review Letters, vol. 91, No. 16, Oct. 2003.

\* cited by examiner

MAGNETIC READ SENSOR EMPLOYING OBLIQUE ETCHED UNDERLAYERS FOR INDUCING UNIAXIAL MAGNETIC ANISOTROPY IN HARD MAGNETIC BIAS LAYERS

The present invention is related to patent application Ser. No. 11/097,638 filed on Mar. 31, 2005 entitled MAGNETIC READ SENSOR EMPLOYING OBLIQUE ETCHED UNDERLAYERS FOR INDUCING UNIAXIAL MAGNETIC ANISOTROPY IN A HARD MAGNETIC IN-STACK BIAS LAYER having the same inventors as the present application.

The present invention is related to patent application Ser. No. 11/097,920 filed on Mar. 31, 2005 entitled MAGNETIC READ SENSOR EMPLOYING OBLIQUE ETCHED UNDERLAYERS FOR INDUCING UNIAXIAL MAGNETIC ANISOTROPY IN A HARD MAGNETIC PINNING LAYER having the same inventors as the present application The present invention is related to patent application Ser. No. 11/097,543 filed on Mar. 31, 2005 entitled METHOD FOR MANUFACTURING A MAGNETIC READ SENSOR EMPLOYING OBLIQUE ETCHED UNDERLAYERS FOR INDUCING UNIAXIAL MAGNETIC ANISOTROPY IN A HARD MAGNETIC IN-STACK BIAS LAYER having the same inventors as the present application.

The present invention is related to patent application Ser. No. 11/097,546 filed on Mar. 31, 2005 entitled A METHOD FOR MANUFACTURING A MAGNETIC READ SENSOR EMPLOYING OBLIQUE ETCHED UNDERLAYERS FOR INDUCING UNIAXIAL MAGNETIC ANISOTROPY IN A HARD MAGNETIC PINNING LAYER having the same inventors as the present application.

The present invention is related to patent application Ser. No. 11/097,846 filed on Mar. 31, 2005 entitled A METHOD FOR MANUFACTURING A MAGNETIC READ SENSOR EMPLOYING OBLIQUE ETCHED UNDERLAYERS FOR INDUCING UNIAXIAL MAGNETIC ANISOTROPY IN HARD MAGNETIC BIAS LAYERS having the same inventors as the present application.

FIELD OF THE INVENTION

The present invention relates to magnetoresistive field sensors and more particularly to a sensor having hard magnetic bias layers with strong magnetic anisotropy formed on an obliquely etched underlayer.

BACKGROUND OF THE INVENTION

The heart of a computer's long term memory is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider toward the surface of the disk and when the disk rotates, air adjacent to the surface of the disk moves along with the disk. The slider flies on this moving air at a very low elevation (fly height) over the surface of the disk. This fly height is on the order of nanometers. When the slider rides on the air bearing, the write and read heads are employed for writing magnetic transitions to and reading magnetic transitions from the rotating disk. The read and write heads are connected to processing circuitry that operates according to a computer program to implement the writing and reading functions.

The write head includes a coil layer embedded in first, second and third insulation layers (insulation stack), the insulation stack being sandwiched between first and second pole piece layers. A gap is formed between the first and second pole piece layers by a gap layer at an air bearing surface (ABS) of the write head and the pole piece layers are connected at a back gap. Current conducted to the coil layer induces a magnetic flux in the pole pieces which causes a magnetic field to fringe out at a write gap at the ABS for the purpose of writing the aforementioned magnetic impressions in tracks on the moving media, such as in circular tracks on the aforementioned rotating disk.

In recent read head designs a spin valve sensor, also referred to as a giant magnetoresistive (GMR) sensor, has been employed for sensing magnetic fields from the rotating magnetic disk. This sensor includes a nonmagnetic conductive layer, hereinafter referred to as a spacer layer, sandwiched between first and second ferromagnetic layers, hereinafter referred to as a pinned layer and a free layer, both of which can be made up by a plurality of layers. First and second leads are connected to the spin valve sensor for conducting a sense current therethrough. The magnetization of the pinned layer is pinned perpendicular to the air bearing surface (ABS) and is relatively insensitive to applied magnetic fields. The magnetic moment of the free layer is biased parallel to the ABS, but is free to rotate in response to external magnetic fields. The magnetization of the pinned layer is typically pinned by exchange coupling with an antiferromagnetic layer.

The thickness of the spacer layer is chosen to be less than the mean free path of conduction electrons through the sensor. With this arrangement, a portion of the conduction electrons is scattered by the interfaces of the spacer layer with each of the pinned and free layers. When the magnetizations of the pinned and free layers are parallel with respect to one another, scattering is minimal and when the magnetizations of the pinned and free layer are antiparallel, scattering is maximized. Changes in scattering alter the resistance of the spin valve sensor in proportion to $\cos \Theta$, where $\Theta$ is the angle between the magnetizations of the pinned and free layers. Since $\Theta$ is near 90 degrees at zero field, the resistance of the spin valve sensor (for small rotations of the free layer from 90 degrees) changes proportionally to the magnitudes of the magnetic fields from the rotating disk. When a sense current is conducted through the spin valve sensor, resistance changes cause potential changes that are detected and processed as playback signals.

When a spin valve sensor employs a single pinned layer it is referred to as a simple spin valve. When a spin valve employs an antiparallel (AP) pinned layer it is referred to as an AP pinned spin valve. An AP pinned spin valve includes first and second magnetic layers separated by a thin nonmagnetic coupling layer such as Ru or Ir. The thickness of the coupling layer is chosen so as to antiparallel couple the magnetic moments of the ferromagnetic layers of the pinned layer. A spin valve is also known as a top or bottom spin valve depending upon whether the pinning layer is at the top (formed after the free layer) or at the bottom (before the free layer).

Magnetization of the pinned layer is usually fixed by exchange coupling one of the ferromagnetic layers (AP1) with a layer of antiferromagnetic material such as PtMn. While an antiferromagnetic (AFM) material such as PtMn does not in and of itself have a net magnetic moment, when exchange coupled with a magnetic material, it can strongly pin the magnetization of the ferromagnetic layer.

A CIP spin valve sensor is located between first and second nonmagnetic electrically insulating read gap layers and the first and second read gap layers are located between ferromagnetic first and second shield layers. In a merged magnetic head a single ferromagnetic layer functions as the second shield layer of the read head and as the first pole piece layer of the write head. In a piggyback head the second shield layer and the first pole piece layer are separate layers.

The ever increasing demand for greater data rate and recording density has lead a push to develop perpendicular to plane (CPP) sensors which are uniquely suited to use in such systems. CPP sensors include both CPP giant magneto-resistive (GMR) sensors, which use an electrically conductive spacer layer such as Cu as well as tunnel magneto-resistive (TMR) sensors, which use a thin, electrically insulating barrier layer like Al-oxide. The CPP GMR sensor operates based on spin-dependent bulk and interface scattering of the electrons while the TMR sensor operates based on the spin dependent tunneling of electrons through the barrier layer.

In order to stabilize the free layer in CIP GMR, CPP GMR, or CPP TMR sensors against fluctuations due to thermal agitation and to prevent it from breaking up into domains it needs to be biased. One form of biasing a sensor is by using a hard magnetic biasing layer, typically a $Co_{1-x}Pt_x$ or $Co_{1-x-y}Pt_xCr_y$ alloy (x being between 10 and 35 atomic % and y between 0 and 15 atomic %) deposited onto a suitable underlayer material on both sides and about the same level as the free layer. Typically the hard magnetic bias layers also comprise a seed layer of Cr or CrX (X=Mo, Ti, V) on which the magnetic $Co_{1-x}Pt_x$ or $Co_{1-x-y}Pt_xCr_y$ material is deposited to achieve crystalline texture and sufficiently high coercivity. An insulating gap separates the free and the hard biasing layers in CPP sensors to prevent electrical shunting. The hard magnetic bias layer has sufficiently high coercivity and remanence so that its remanent moment magnetostatically biases the free layer in a direction substantially parallel to the ABS. The total moment of the hard bias layer is typically several times the magnetic moment of the free layer. The actual moment value depends on the hard bias material, its shape and separation from the free layer.

One major problem with CoPt, CoPtCr, and other hard magnets in general is that they are magnetically isotropic in the plane and there is no pair ordering upon annealing which could establish a magnetic easy axis. Thus shape anisotropy needs to be employed to obtain an in-plane easy axis of the hard biasing layers in a direction substantially parallel to the ABS. As used herein substantially parallel means that the easy axis is closer to parallel than perpendicular to the ABS. Therefore the hard biasing layers are extended laterally in a direction parallel to the ABS, and parallel to the desired easy axis of the magnetic free layer. The ability of such shape induced anisotropy to produce a sufficiently strong in plane easy axis is, however, limited by design constraints. This is especially true in present and future generation extremely-small sensors.

Therefore, there is a strong felt need for a mechanism to generate a uniaxial magnetic anisotropy other than shape anisotropy to set the magnetic anisotropy of a hard magnetic layer such as CoPt or CoPtCr in a user defined direction independent of the shape of the sensor.

SUMMARY OF THE INVENTION

The present invention provides a hard bias layer structure having a magnetic easy axis (magnetic anisotropy) oriented in a specific direction substantially parallel with the ABS. The sensor includes a sensor stack and hard bias layers extending laterally from the sides of the sensor stack. The hard bias layer is deposited over an underlayer that has been ion beam etched at an angle with respect to the normal to the surface of the underlayer in order to form oriented ripples or facets in the surface of the underlayer.

The underlayer may comprise Pt, Ta, PtMn, Cr, Ru, W, Mo, Cu, their alloys, or other preferably crystalline materials. The hard bias layer deposited thereover may be, for example, CoPt, CoPtCr, typically on a seed layer of Cr or a Cr-alloy, or some other hard magnetic material on a suitable seed layer. The anisotropic roughness in form of oriented ripples formed by this ion etch may run along a direction substantially perpendicular to the ABS and induce a strong magnetic uniaxial anisotropy in the subsequently deposited hard magnetic biasing layers in a direction substantially parallel to the ABS.

The strong magnetic uniaxial anisotropy produced by the present invention ensures sufficient magnetic biasing of the free layer even at the extremely small sensor sizes of present and future generation sensors. The magnetic anisotropy of the hard bias layers also prevents loss of free layer biasing during high temperature events such as from a head-disk contact.

These and other advantages and features of the present invention will be apparent upon reading the following detailed description in conjunction with the Figures.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION OF THE PREFERRED EMBODIMENTS

The following description is of the best embodiments presently contemplated for carrying out this invention. This description is made for the purpose of illustrating the general principles of this invention and is not meant to limit the inventive concepts claimed herein.

Figure 1:
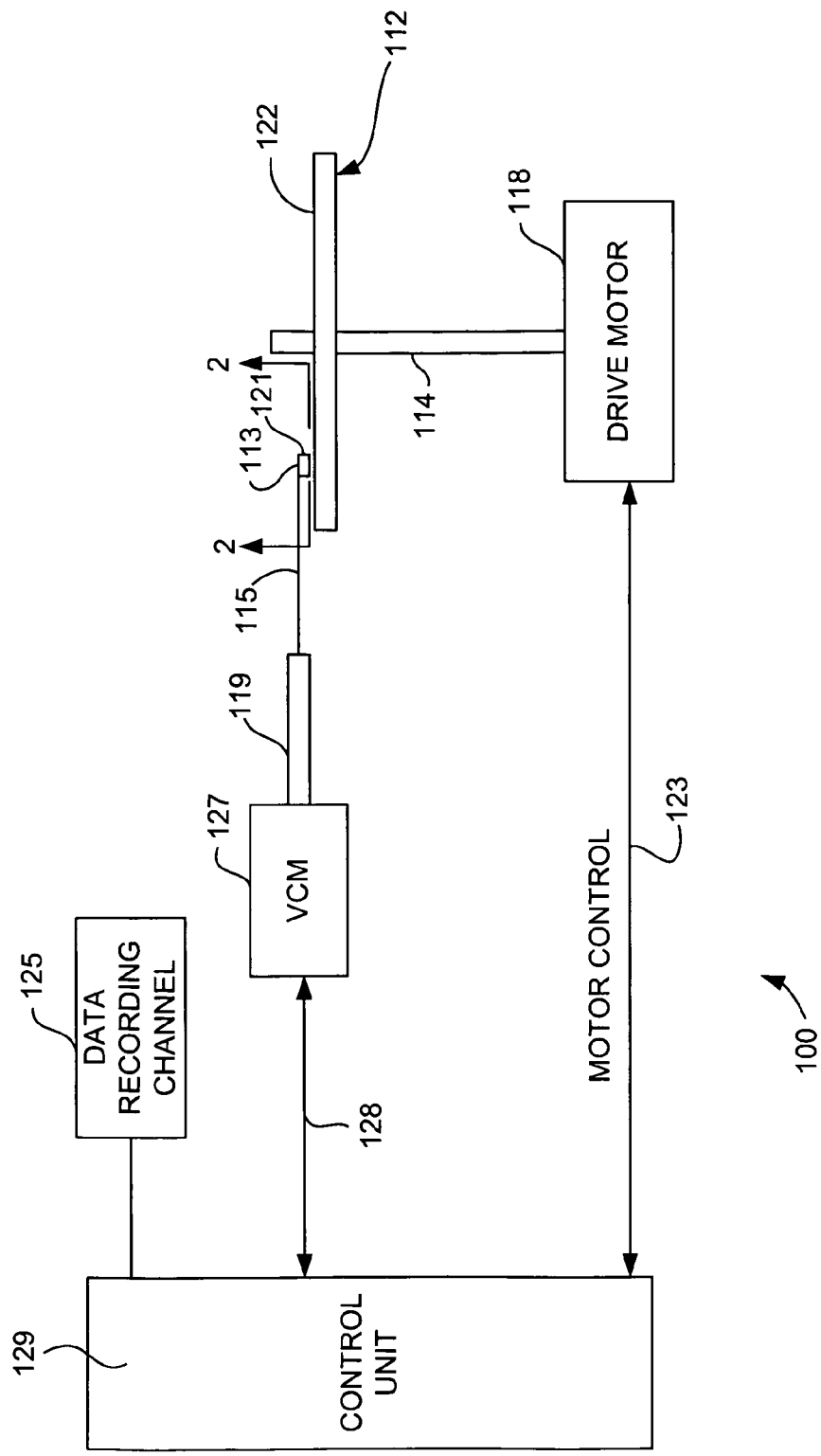
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
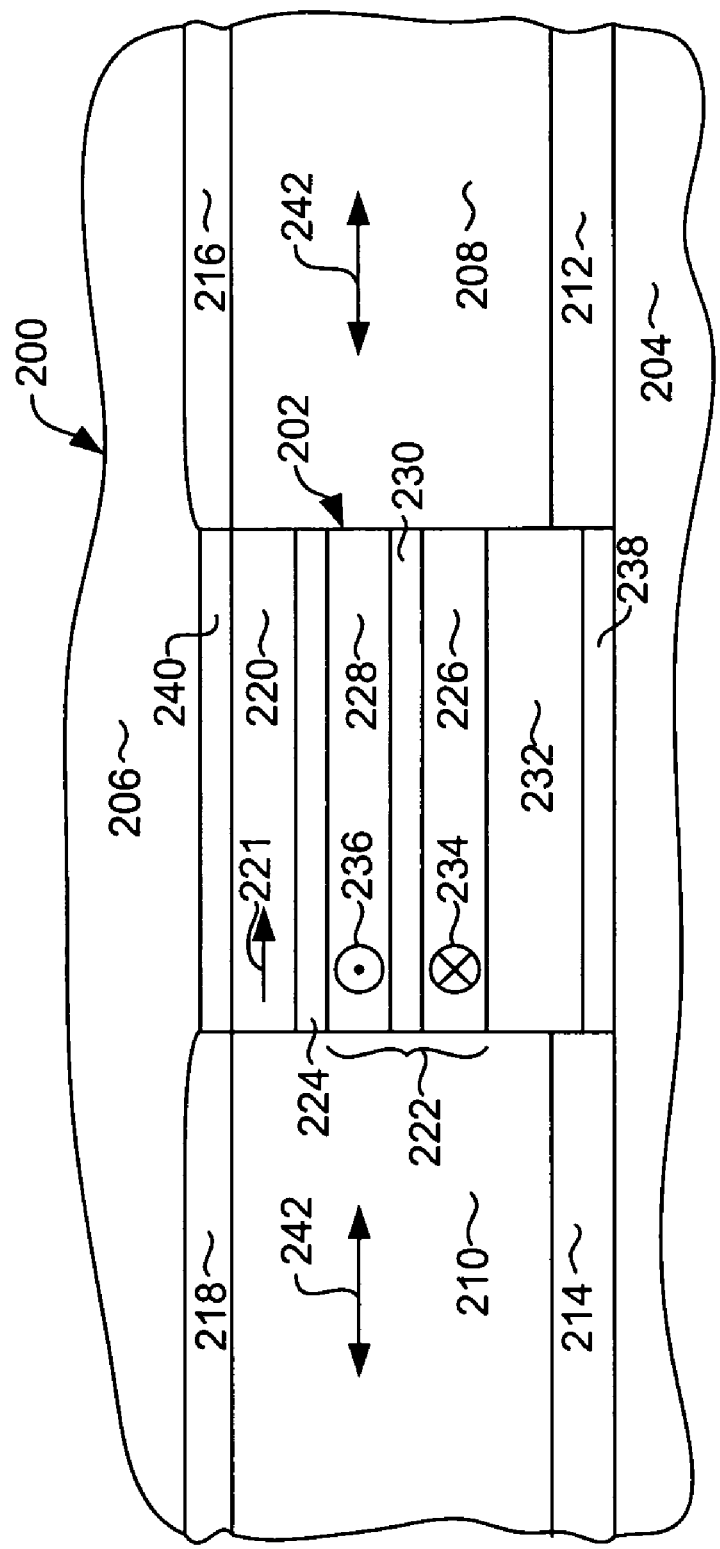
FIG. 2, is an ABS view of a CIP sensor according to a first embodiment of the invention.

With reference now to FIG. 2, a CIP GMR sensor 200 having hard bias layers manufactured according to the present invention is described. The sensor 200 includes a sensor stack 202 sandwiched between first and second non-magnetic, electrically insulating gap layers 204, 206. The first and second hard bias layers 208, 210 extend laterally from the sides of the sensor stack 202. The hard bias layers are deposited over underlayers 212, 214 which will be described in greater detail herein below. First and second leads 216, 218 are deposited over the hard bias layers 208, 210, and may be constructed of for example Au, Rh or some other electrically conductive material.

With continued reference to FIG. 2, the sensor stack 202 includes a magnetic free layer 220, a magnetic pinned layer structure 222 and a spacer layer 224 sandwiched between the free and pinned layers 220, 222. The free layer 220 has a magnetic moment 221 that is biased in a direction parallel with a medium facing surface, which may be an air bearing surface or a contact bearing surface. Although moment 221 is biased parallel with the medium facing surface, it is free to rotate in response to a magnetic field. The pinned layer may be of various configurations, such as simple, AP coupled, AFM pinned or self pinned. The free layer 220 can be constructed of one or more layers of for example NiFe, Co, CoFe or other sufficiently soft magnetic material, preferably with a layer of Co or CoFe adjacent to the spacer layer 224. The spacer layer 224 can be constructed of a non-magnetic, electrically conductive material such as Cu.

The pinned layer 222 is preferably an AP coupled pinned layer having first and second magnetic layers AP1 226 and AP2 228 which are antiparallel coupled across an AP coupling layer 230. The AP1 and AP2 layers can be for example CoFe or some other suitable magnetic material. The coupling layer 230 can be constructed of, for example, Ru or Ir and is constructed of a thickness chosen to strongly antiparallel couple the magnetic moments 234 and 236 of the AP1 and AP2 layers, respectively. The coupling layer can be for example 2-10 Angstroms thick or about 8 Angstroms thick. The AP1 layer 226 is exchange coupled with a layer of antiferromagnetic material (AFM layer 232) which strongly pins the magnetic moment 234 of the AP1 layer 226 in a desired direction perpendicular to the medium facing surface and due to AP coupling of the AP1 and AP2 layers 226 and 228 pins the moment 236 of the AP2 layer 228 in a desired direction perpendicular to the medium facing surface, but antiparallel with the moment 234 of the AP1 layer 226.

A seed layer 238 may be provided at the bottom of the sensor stack 202 to promote a desired grain structure on the subsequently deposited sensor layers. In addition, a capping layer 240, such as Ta, may be provided to protect the layers of the sensor stack 202 from damage during manufacture.

With reference still to FIG. 2, the hard magnetic bias layers 208, 210 are constructed of a magnetic material having a high coercivity of 1.5 kOe or higher, preferably $Co_{1-x}Pt_x$ or $Co_{1-x-y}Pt_xCr_y$ (x being between 10 and 35 atomic % and y between 0 and 15 atomic %). Typically the hard magnetic bias layers also comprise a seed layer of Cr or CrX (X=Mo, Ti, V) on which the magnetic $Co_{1-x}Pt_x$ or $Co_{1-x-y}Pt_xCr_y$ material is deposited to achieve crystalline texture and sufficiently high coercivity. The magnetic hard bias layers have magnetic moments that are set substantially parallel to the medium facing surface in order to bias the moment 221 of the free layer in a desired direction substantially parallel with the medium facing surface. The bias layers 208, 210 are formed on underlayers 212, 214 which can be for example Pt, Ta, PtMn, Cr, Ru, W, Mo, Cu, their alloys, or other suitable, preferably crystalline material and have been treated as described with reference to FIGS. 4A-4D in order to create anisotropic roughness on the surface of the underlayers 212, 214 and to induce a magnetic anisotropy axis 242 in the bias layers 208 and 210 in a direction substantially parallel with the medium facing surface. This means that the underlayers 212, 214 have been ion beam etched prior to deposition of the hard magnetic bias layers 208, 210 at an angle and direction that must be chosen such that the resulting magnetic easy axis of the hard magnetic bias layers 208, 210 is substantially parallel to the medium facing surface.

The underlayers 212, 214 (which may have a thickness of 30-300 Angstroms after etching) exhibit anisotropic roughness for example in form of oriented ripples or facets in their upper interfaces that run along a direction oriented substantially perpendicular to the medium facing surface (into and out of the plane of the page in FIG. 2). The upper surface of the underlayer may have been oxidized prior to deposition of the hard magnetic bias layer.

Figure 5:
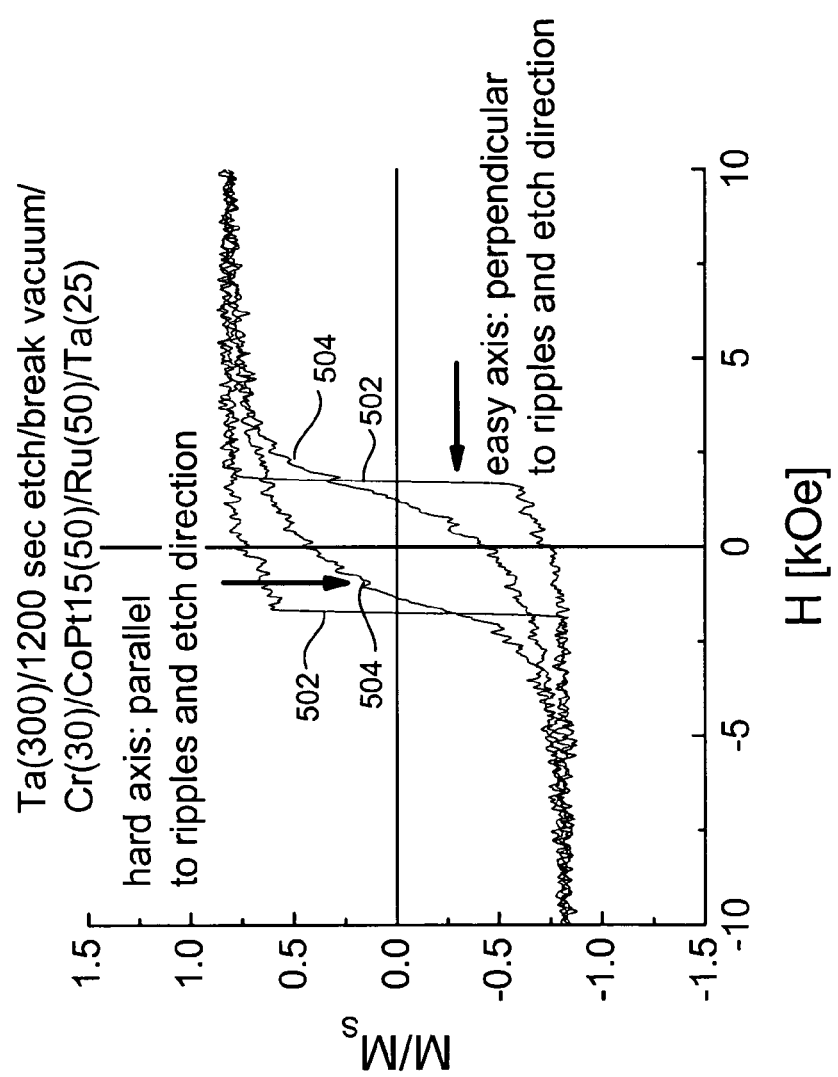
FIG. 5. is a graph illustrating magnetic hysteresis loops of a $Cr(30)/Co_{82}Pt_{18}$ (50) film grown onto a 1200 seconds etched Ta underlayer measured perpendicular and parallel to the ion-beam direction.

FIG. 5 shows magnetic hysteresis loops of hard bias layer 208, 210 formed over an underlayer 212, 214 treated as described above. The lines 502 show the hysteresis loop in response to a magnetic field parallel with the easy axis of the hard bias layer 208, 210. The lines 504 show the hysteresis loops in response to a magnetic field that is perpendicular to the easy axis of the hard bias layers 208, 210. The strong anisotropy 242 of the hard magnetic bias layers 208, 210 greatly facilitates effective biasing of the free layer 220. As sensors become smaller, effective stable biasing becomes increasingly difficult. The strong anisotropy 242 provided by the present invention, therefore, greatly facilitates stable free layer biasing in a very small magnetoresistive sensor.

Figure 3:
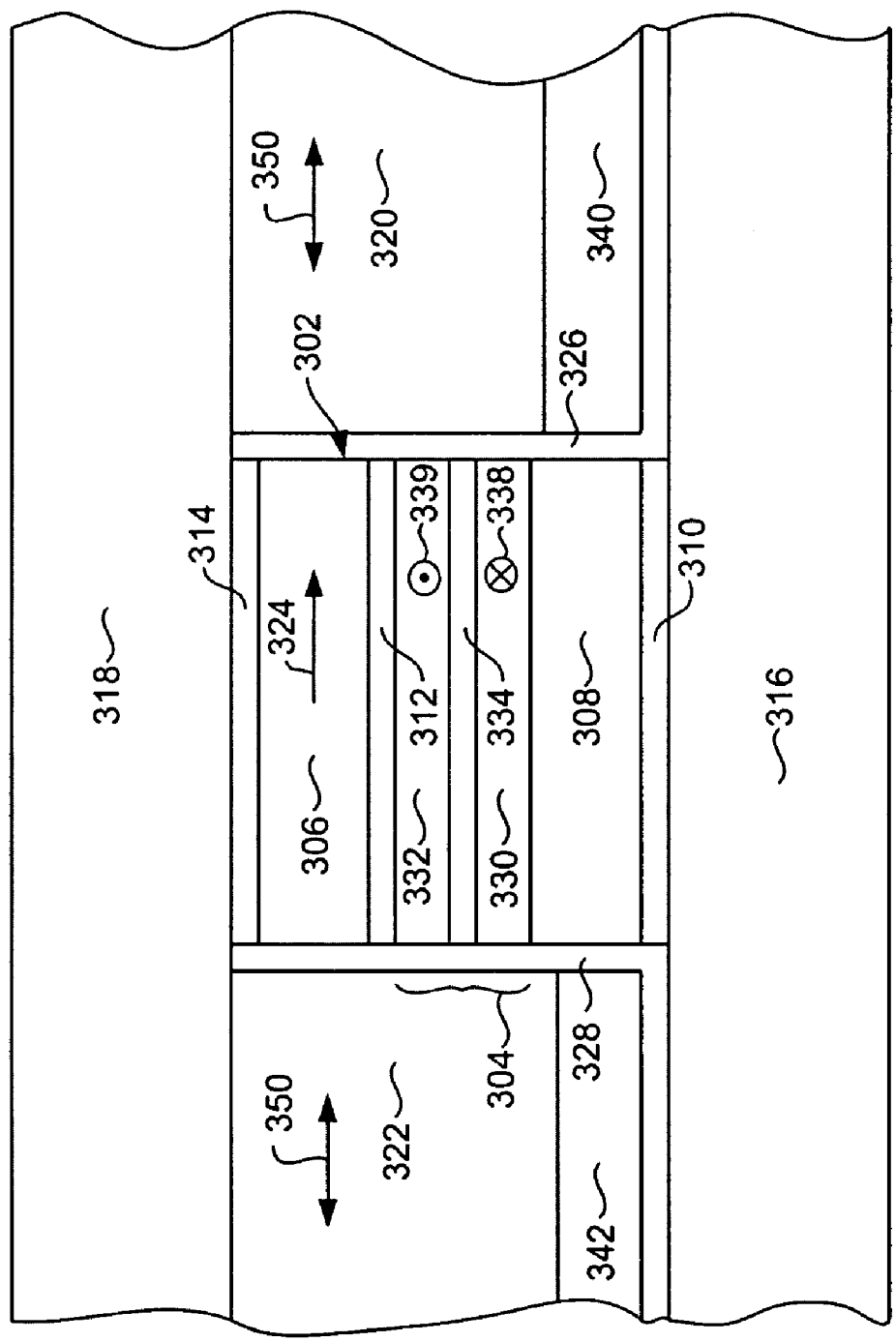
FIG. 3 is an ABS view of a CPP sensor according to a second embodiment of the invention.
Figure 4A:
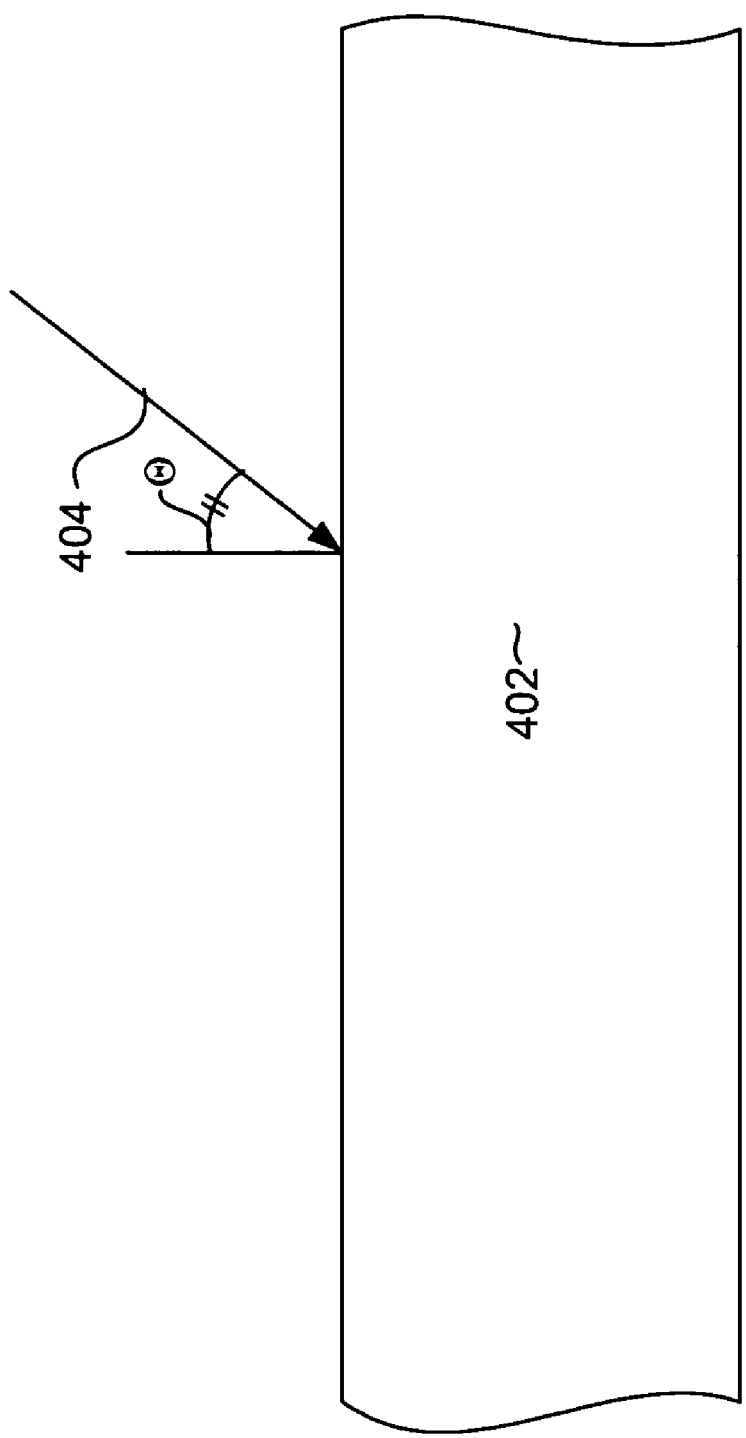
FIGS. 4A through 4D are cross sectional views illustrating a method of setting magnetic anisotropy in a magnetic layer according to the present invention.
Figure 4B:
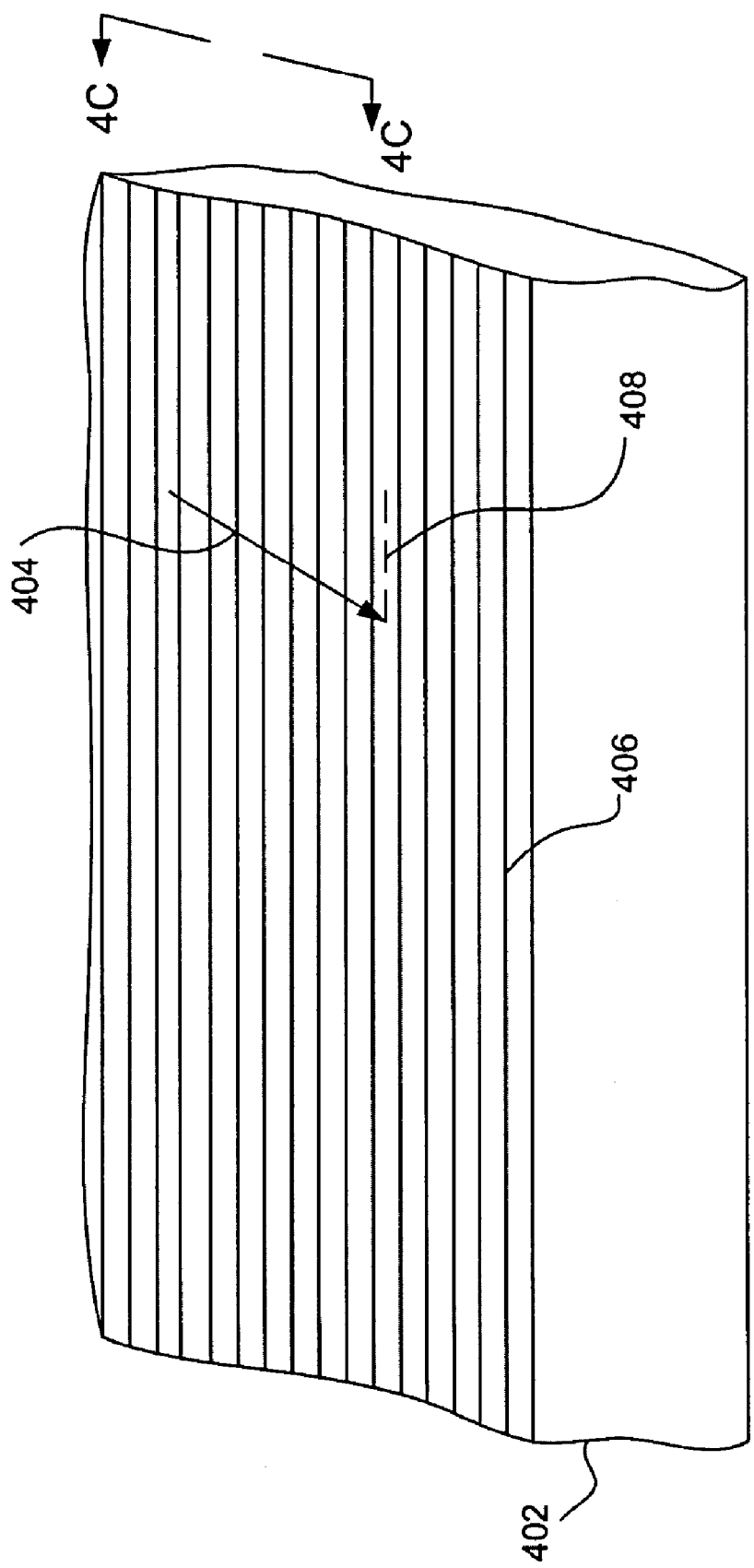
Figure 4C:
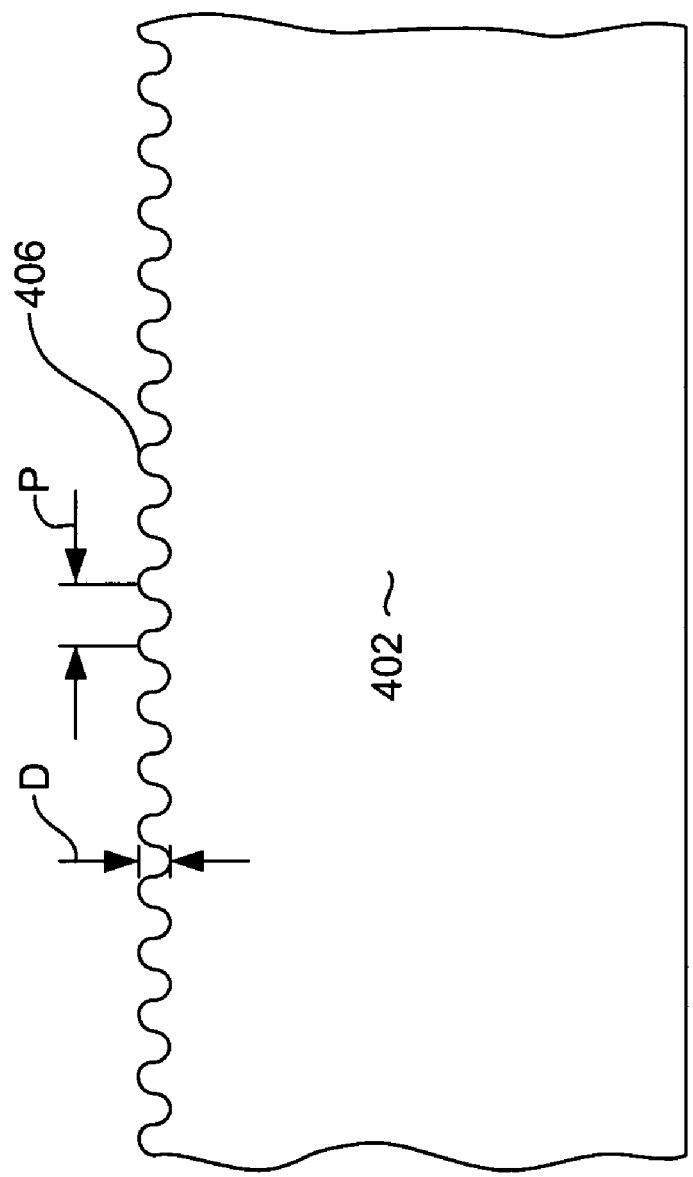
Figure 4D:
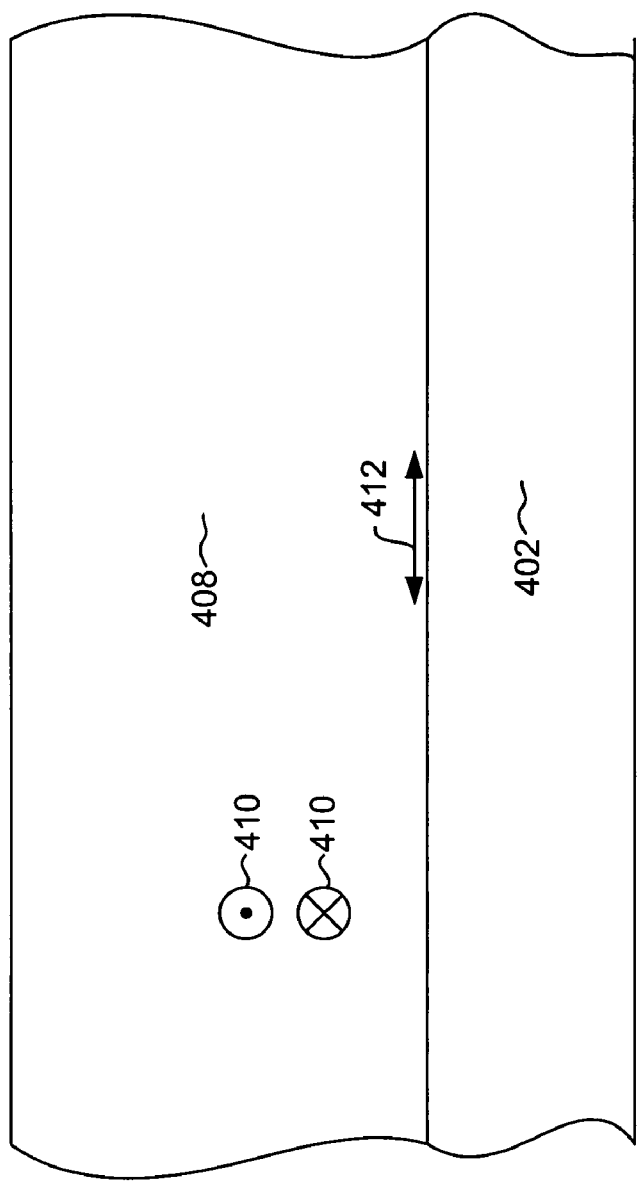

With reference to FIG. 3, the present invention can also be practiced in a CPP sensor, such as a CPP GMR or CPP TMR sensor, having a sensor stack 302 comprising a pinned layer structure 304, and a free layer 306. For a CPP GMR sensor the free and pinned layers 304, 306 are separated by a non-magnetic, electrically conductive spacer layer 312, which may be, for example, Cu. For a CPP TMR sensor the free and pinned layers 304, 306 are separated by a non-magnetic, electrically insulating barrier layer 312, which may be, for example, Al-oxide. A capping layer 314, such as Ta, may also be provided at the top of the sensor stack 302 to protect the sensor layers from damage during manufacture.

With continued reference to FIG. 3, the sensor stack is sandwiched between first and second electrically conductive, magnetic shields 316, 318 which may be constructed of, for example NiFe, and serve as first and second electrical leads for providing a sense current to the sensor stack 302. Hard magnetic bias layers 320, 322 are provided for biasing the magnetic moment 324 of the free layer 306 in a direction substantially parallel with the medium facing surface. First and second insulation layers 326, 328 are provided to prevent current shunting between the shields through the hard bias layers 320, 322.

The free layer 306 may be constructed of one or more layers of for example NiFe, Co, CoFe, or other sufficiently soft magnetic material, preferably with a layer of Co or CoFe adjacent to the spacer layer 312. The pinned layer structure 304 may be a simple, single layer pinned layer, but is more preferably an AP pinned structure having first and second magnetic layers AP1 330, AP2 332 separated from one another by an antiparallel coupling layer (AP coupling layer) 334. The AP1 and AP2 layers 330, 332 can be constructed of, for example, CoFe and the AP coupling layer 334 can be Ru or Ir.

As with the previously described embodiment, the first magnetic layer 330 can be exchange coupled with a layer of antiferromagnetic material 308 to pin the magnetizations 338, 339 of the magnetic layers 330, 332. A seed layer 310 may be provided at the bottom of the sensor stack 302.

With reference still to FIG. 3, the hard magnetic bias layers 320, 322 are constructed of a magnetic material having a high coercivity of 1.5 kOe or higher, preferably $Co_{1-x}Pt_x$ or $Co_{1-x-y}Pt_xCr_y$ (x being between 10 and 35 atomic % and y between 0 and 15 atomic %). Typically the hard magnetic bias layers also comprise a seed layer of Cr or CrX (X=Mo, Ti, V) on which the magnetic $Co_{1-x}Pt_x$ or $Co_{1-x-y}Pt_xCr_y$ material is deposited to achieve crystalline texture and sufficiently high coercivity. The hard bias layers have magnetic moments that are set substantially parallel to the medium facing surface in order to bias the moment 324 of the free layer in a desired direction substantially parallel with the medium facing surface. The hard magnetic bias layers 320, 322 are formed on underlayers 340, 342 which can be for example Pt, Ta, PtMn, Cr, Ru, W, Mo, Cu, their alloys or another suitable, preferably crystalline material. The underlayers 340, 342 have been treated as described with reference to FIGS. 4A-4D in order to create anisotropic roughness on the surface of the underlayers 340, 342 and to induce a magnetic anisotropy axis 350 in the bias layers 320 and 322 in a direction substantially parallel with the medium facing surface. This means that the underlayers 340, 342 have been ion beam etched prior to deposition of the hard magnetic bias layers 320, 322 at an angle and direction that must be chosen such that the resulting magnetic easy axis of the hard magnetic bias layers 320, 322 is substantially parallel to the medium facing surface.

The underlayers 340, 342 (which may have a thickness of 30-300 Angstroms after etching) exhibit anisotropic roughness for example in form of oriented ripples or facets in their upper interface that run along a direction oriented substantially perpendicular to the medium facing surface (into and out of the plane of the page in FIG. 3).

The strong anisotropy 350 of the bias layers 320, 322 greatly facilitates effective biasing of the free layer 306. As sensors become smaller, effective stable biasing becomes increasingly difficult. The strong anisotropy 350 provided by the present invention, therefore, promotes stable free layer biasing in a very small magnetoresistive sensor.

With reference to FIGS. 4A through 4D, The underlayers 212, 214 (FIG. 2) and 340, 342 (FIG. 3) are constructed by depositing a material 402, which could be for example Pt, Ta, PtMn, Cr, Ru, W, Mo, Cu, their alloys, or some other suitable, preferably crystalline, material. The underlayer material 402 can be for example 30 to 300 Angstroms or about 100 Angstroms thick after ion beam etching. An ion beam etch 404 is then performed at an angle Θ with respect to a normal to the surface of the underlayer 402. The angled ion etch induces anisotropic roughness for example in form of oriented ripples or facets 406 that run in a direction substantially parallel to the in plane projection 408 of the ion beam onto the surface of the layer 402. The typical or average pitch P of the ripples 406 is between 10-200 nm, their average depth D is between 0.5 to 5 nm or about 1 nm.

After the angled ion etch 404 has been performed sufficiently to form the desired ripples or facets 406, a layer of hard magnetic material 408 (FIG. 4D) is deposited. The hard magnetic material 408 can be for example CoPt or CoPtCr can include multiple layers, such as a seed layer of Cr or CrX (X=Mo, Ti, V) and a layer of CoPt or CoPtCr. The magnetic easy axis 410 of the applied hard magnetic material 406 will be substantially perpendicular to the direction 412 of the ripples and substantially perpendicular to the in plane projection 406 (FIG. 4B) of the angled ion etch onto the surface of the under layer 402. If another suitable hard magnetic material is used instead of CoPt or CoPtCr, the magnetic easy axis may be either substantially parallel or substantially perpendicular to the direction 412 of the ripples. The ion etch direction must be chosen such that the resulting magnetic easy axis of the hard magnetic bias layers is substantially parallel to the medium facing surface.

The angled ion etch 404 is preferably performed at an angle of between 20 and 80 degrees and is more preferably performed at an angle of between 35 and 65 degrees with respect to the normal to the surface of the underlayer 402. The exact voltage, current, and angle conditions depend on the type and characteristics of the ion source in use.

In one demonstration of the above described treatment method, about 300 Angstroms of Ta were deposited and etched under an angle of about 45 degrees from normal for 1200 seconds at an ion source voltage of 100 Volts and a flux of 1 Ampere. The etch rate was about 5-7 Angstroms per minute. The Ta samples were taken out of vacuum and reintroduced into another deposition system. Thus some oxide layer formed on the top of the Ta. Finally a seed layer of about 30 Angstroms of Cr, about 50 Angstroms of $Co_{82}Pt_{18}$ hard magnetic bias material, and about 50 Angstroms of Ru, and about 25 Angstroms of Ta cap material were deposited onto the treated underlayer. Magnetization measurements shown in FIG. 5 demonstrate that a uniaxial anisotropy is introduced by the ion beam etch. The easy axis is perpendicular to the in-plane projection of the ion beam during etching. The structural origin was investigated by X-ray diffraction. The reflectivity rocking curves of an etched Ta substrate taken with the projection of the X-rays and the ion beam parallel and perpendicular to each other exhibit an enhancement of the diffusive background in the direction perpendicular to the ion beam. This is a clear indication of the change in substrate morphology with anisotropic roughness for example in form of oriented ripples or facets running along the direction of the ion beam. The $Co_{82}Pt_{18}$ easy axis is perpendicular to axis of the ripples or facets. Underlayers with various crystalline structures including Ta (body centered tetragonal), Cr (body centered cubic), PtMn (body centered tetragonal), Cu (face centered cubic), and Ru (hexagonal closed packed) have been ion beam etched in a fashion similar to what is described above and a Cr(35)/CoPt$_{18}$(50) bilayer was deposited ontop. Magnetic measurements revealed a CoPt$_{18}$ easy axis perpendicular to the ion beam direction showing that the effect is independent of the type of crystalline structure.

While various embodiments have been described above, it should be understood that they have been presented by way of example only, and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A magnetoresistive sensor having an air bearing surface, comprising:
    a sensor stack including a magnetic free layer, a magnetic pinned layer, and a non-magnetic layer sandwiched between the free and pinned layers;
    an underlayer extending laterally from the sensor stack, the underlayer having a surface that has an anisotropic roughness;
    a hard magnetic bias layer, formed over the underlayer and extending laterally from the sensor stack.

2. A magnetoresistive sensor as in claim 1 wherein the hard magnetic bias layer has a magnetic anisotropy oriented substantially parallel to the air bearing surface.

3. A magnetoresistive sensor as in claim 1 wherein the anisotropic roughness comprises ripples or facets.

4. A magnetoresistive sensor as in claim 1 wherein the anisotropic roughness comprises ripples or facets that extend along a direction substantially perpendicular to the air bearing surface.

5. A magnetoresistive sensor as in claim 1 wherein the underlayer comprises a material having a crystalline structure.

6. A magnetoresistive sensor as in claim 1 wherein the underlayer comprises a material having body centered cubic or body centered tetragonal crystal structure.

7. A magnetoresistive sensor as in claim 1 wherein the underlayer comprises a material having face centered cubic or face centered tetragonal crystal structure.

8. A magnetoresistive sensor as in claim 1 wherein the underlayer comprises a material having hexagonally closed packed crystal structure.

9. A magnetoresistive sensor as in claim 1 wherein the underlayer comprises Pt, Ta, PtMn, Cr, Ru, W, Mo, Cu, or their alloys.

10. A magnetoresistive sensor as in claim 1 wherein the surface of the underlayer is oxidized.

11. A magnetoresistive sensor as in claim 1 wherein the upper surface of the underlayer exhibits anisotropic roughness in the form of ripples having an average pitch of 10-200 nm.

12. A magnetoresistive sensor as in claim 1 wherein the upper surface of the underlayer exhibits an anisotropic roughness in form of ripples having an average depth of 0.5-5 nm.

13. A magnetoresistive sensor as in claim 1 wherein the underlayer has a thickness of 30-300 Angstroms after ion beam etching.

14. A magnetoresistive sensor as in claim 1 wherein the hard magnetic bias layer comprises an alloy of Co and Pt.

15. A magnetoresistive sensor as in claim 1 wherein a crystalline seed layer is disposed between the underlayer and the hard magnetic bias layer, and wherein the hard magnetic bias layer comprises an alloy of Co and Pt.

16. A magnetoresistive sensor as in claim 1 wherein a seed layer of Cr or CrX (X=Mo, Ti, V) is disposed between the underlayer and the hard magnetic bias layer, and wherein the hard magnetic bias layer comprises an alloy of Co and Pt.

17. A magnetoresistive sensor as in claim 1 wherein the hard magnetic bias layer comprises an alloy of CoPt$_x$Cr$_y$, x being between 10 and 35 atomic percent and y being between 0 and 15 atomic percent.

18. A magnetoresistive sensor as in claim 1 wherein a crystalline seed layer is disposed between the underlayer and the hard magnetic bias layer and wherein the hard magnetic bias layer comprises CoPt$_x$Cr$_y$, x being between 10 and 35 atomic percent and y being between 0 and 15 atomic percent.

19. A magnetoresistive sensor as in claim 1 wherein a seed layer of Cr or CrX (X=Mo, Ti, V) is disposed between the underlayer and the hard magnetic bias layer and wherein the hard magnetic bias layer comprises CoPt$_x$Cr$_y$, x being between 10 and 35 atomic percent and y being between 0 and 15 atomic percent.

20. A magnetoresistive sensor as in claim 1 wherein the hard bias layer comprises an alloy of Co and the wherein the underlayer comprises a material having a crystalline structure.

21. A magnetoresistive sensor as in claim 1 wherein the hard bias layer comprises an alloy of CoPt$_x$Cr$_y$, x being between 10 and 35 atomic percent and y being between 0 and 15 atomic percent and wherein the underlayer comprises a material having crystalline structure.

22. A magnetoresistive sensor as in claim 1 wherein the hard bias layer comprises an alloy of CoPt$_x$Cr$_y$, x being between 10 and 35 atomic percent and y being between 0 and 15 atomic percent and wherein the underlayer comprises a material selected from the group consisting of Pt, Ta, PtMn, Cr, Ru, W, Mo, Cu, or their alloys.

23. A magnetoresistive sensor as in claim 1, wherein the sensor is a current in plane GMR sensor.

24. A magnetoresistive sensor as in claim 1 wherein the sensor is a current perpendicular to plane GMR sensor.

25. A magnetoresistive sensor as in claim 1 wherein the sensor is a tunnel valve.

* * * * *